US007010557B2

(12) United States Patent
Wang

(10) Patent No.: US 7,010,557 B2
(45) Date of Patent: Mar. 7, 2006

(54) LOW POWER DECIMATION SYSTEM AND METHOD OF DERIVING SAME

(75) Inventor: Minsheng Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 558 days.

(21) Appl. No.: 10/106,549

(22) Filed: Mar. 27, 2002

(65) Prior Publication Data

US 2003/0187894 A1 Oct. 2, 2003

(51) Int. Cl.
*G06F 17/17* (2006.01)

(52) U.S. Cl. ...................................................... 708/313

(58) Field of Classification Search ................ 708/313, 708/319

See application file for complete search history.

(56) References Cited

U.S. PATENT DOCUMENTS

| | | | | |
|---|---|---|---|---|
| 5,268,905 | A | 12/1993 | Soloff et al. | |
| 5,596,609 | A | 1/1997 | Genrich et al. | |
| 5,880,687 | A | 3/1999 | May et al. | |
| 5,880,973 | A | 3/1999 | Gray et al. | |
| 6,233,594 | B1 | 5/2001 | Tan et al. | |
| 6,260,053 | B1 * | 7/2001 | Maulik et al. | 708/313 |
| 6,279,019 | B1 | 8/2001 | Oh et al. | |
| 6,532,273 | B1 | 3/2003 | Mobin et al. | |

OTHER PUBLICATIONS

Brandt, B.P. and Wooley, B.A., "A Low-Power, Area Efficient Digital Filter for Decimation and Interpolation," *IEEE Journal of Solid-State Circuits*, vol. 29, pp. 679-687, Jun. 1994.

Hogenauer, E.B., "An Economical Class of Digital Filters for Decimation and Interpolation," *IEEE Transactions on Acoustics, Speech, and Signal Processing*, vol. ASSP-29, No. 2, pp. 155-162, Apr. 1981.

Maulik, P.C. et al., A 16-Bit 250-kHz Delta-Sigma Modulator and Decimation Filter, *IEEE Journal of Solid-State Circuits*, vol. 35, No. 4, pp. 458-466, Apr. 2000.

Lin, K. et al., "Digital Filters for High Performance Audio Delta-sigma Analog-to-digital and Digital-to-analog conversions," *Proceedings of ICSP '96*, pp. 59-63, 1996.

Crochiere, R.E. and Rabiner, L.R., "Interpolation and Decimation of Digital Signals—A Tutorial Review," *Proceedings of the IEEE*, vol. 69, No. 3, pp. 300-331, Mar. 1981.

European Search Report from European Patent Appl. No. 03006956.1, 4 pages, dated Jan. 29, 2004.

* cited by examiner

*Primary Examiner*—Chuong D. Ngo
(74) *Attorney, Agent, or Firm*—Sterne, Kessler, Goldstein & Fox P.L.L.C.

(57) ABSTRACT

A decimation system comprising a plurality, L, of cascaded Finite Impulse Response (FIR) decimation filters. Each decimation filter has a transfer function of the form $H(z)=(1+z^{-1})^N$, where N is an integer. Each FIR decimation filter performs decimation by a common factor I. The cascaded FIR decimation filters together achieve a decimation result substantially identical to that of an $N^{th}$-order CIC filter (that is, a CIC filter having N integrator stages) that performs decimation by a factor $I^L$.

10 Claims, 8 Drawing Sheets

LOW POWER DECIMATION SYSTEM AND METHOD OF DERIVING SAME

BACKGROUND OF THE INVENTION

1. Field of the Invention

The present invention relates generally to digital filters, and more particularly, to decimation filters.

2. Related Art

A multirate system processes signals at different sample rates, and typically includes one or more sample rate converters for converting between the different sample rates. A sample rate converter often includes a decimation filter. The decimation filter (also referred to as a decimator) receives an input signal having an input sample rate, frequency band-limits the input signal, and downsamples the input signal by a predetermined downsampling factor (also referred to as a decimation factor). Thus, the decimator produces a band-limited output signal having an output sample rate equal to the input sample rate divided by the downsampling factor. The process performed by the decimator is referred to as "decimation filtering," or just "decimation."

A popular type of decimation filter is a Cascaded Integrator-Comb (CIC) filter. The CIC filter is popular because it achieves generally acceptable decimation results while using a relatively simple structure as compared to some other types of conventional decimation filters. The CIC filter can be implemented using digital circuits. Generally, it is desirable that digital circuits consume as little power as possible. This is especially true where such digital circuits are associated with a multirate system constructed on an integrated circuit (IC). Therefore, there is a need for an improved decimation filter that consumes less power than a CIC filter, while achieving a decimation result that is the same as, or at least substantially the same as, that of the CIC filter.

SUMMARY OF THE INVENTION

A feature of the present invention is an improved decimation filter/system that consumes less power than a CIC filter, while achieving a decimation result that is the same as, or at least substantially the same as, that of the CIC filter. The improved decimation filter has a modular, repeatable structure, that can be conveniently replicated in a digital, integrated circuit. The improved decimation filter can be used instead of a known CIC filter in a multirate system, thereby reducing power consumption in the multirate system. The improved decimation filter causes downsampling to occur at an early stage in the filter, that is, in an input stage of the filter. Thus, subsequent circuitry operates at a sample rate that is less than the high input sample rate. As a result, less circuitry in the improved decimation filter operates at the high input sample rate as compared to the CIC filter.

An embodiment of the present invention is a decimation system comprising a plurality, L, of cascaded Finite Impulse Response (FIR) decimation filters. Each decimation filter has a transfer function of the form $H(z)=(1+z^{-1})^N$, where N is an integer. In one arrangement of the present invention, each FIR decimation filter performs decimation by a common factor I. The cascaded FIR decimation filters together achieve decimation results identical to an $N^{th}$-order CIC filter (that is, a CIC filter having N integrator stages) that performs decimation by a factor $I^L$.

Other aspects of the present invention include specific embodiments of the FIR filters used in the cascade of FIR filters, such as polyphase FIR filter embodiments.

Another aspect of the present invention is a method corresponding to the decimation system mentioned above.

Another embodiment of the present invention is a method of deriving or synthesizing an FIR decimation system from a CIC filter having a predetermined CIC filter transfer function. A first step in the method comprises expanding the CIC transfer function into a plurality of expansion terms. One or more of the plurality of expansion terms are each capable of being commuted with a respective one of one or more decimation factors. A second step comprises commuting each of the one or more expansion terms with the respective decimation factor, to produce a plurality of decimation filter terms. The plurality of decimation filter terms correspond to a plurality of cascaded FIR decimation filter terms that together form the FIR decimation system.

BRIEF DESCRIPTION OF THE DRAWINGS/FIGURES

The present invention is described with reference to the accompanying drawings. In the drawings, like reference numbers indicate identical or functionally similar elements.

FIG. 1 is a block diagram of a known CIC filter implemented using digital circuitry.

FIGS. 2A and 2B together represent an illustration of what is referred to as a commutative sampling rule or identity as applied to sample rate conversion (downsampling or upsampling) and filtering.

DETAILED DESCRIPTION OF THE INVENTION

An embodiment of the present invention is a method of deriving a Finite Impulse Response (FIR) decimation system from a known CIC filter. The method relates to certain features of the CIC filter. Therefore, a know CIC filter is described below in detail, and then the method of the present invention is described.

Known CIC Filter

Figure 1:
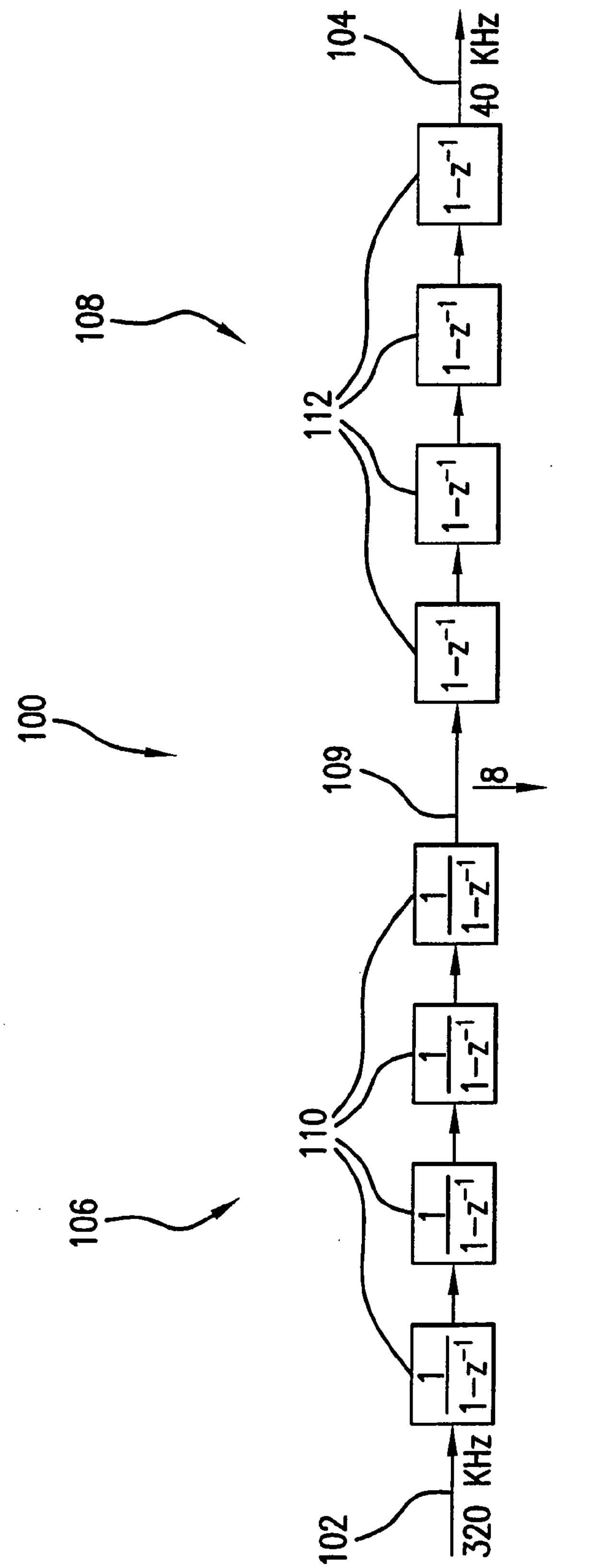

FIG. 1 is a block diagram of a known CIC filter 100 implemented using digital circuitry. CIC filter 100 receives an input signal 102 having an example sample rate of 320 kilohertz (kHz). CIC filter 100 performs decimation filtering of an input signal 102 using a decimation factor of eight (that is, a downsampling factor of eight), to produces a decimated output signal 104 having an example sample rate of 40 kHz (since 40 kHz=320 kHz divided by eight). In FIG. 1, downsampling by a factor of eight is indicated as "↓8." Downsampling by M (for example, M=8) causes M−1 out of every M input samples to be dropped in the downsampled output signal.

CIC filter 100 includes an integrator 106 and a filter/downsampler 108 following the integrator. Integrator 106 integrates signal 102, to produce an integrated (and thus, band-limited) intermediate signal 109. Filter/downsampler 108 filters signal 109 and downsamples signal 109 by the decimation factor of eight, to produce decimated output signal 104.

Integrator 106 includes a plurality of cascaded Infinite Impulse Response (IIR) integrator stages 110. "Cascaded" elements (such as filters, integrators, and so on) include elements that are coupled in series with each other such that an output of one element is coupled to an input of a next or successive element.

In the example of FIG. 1, integrator 102 is referred to as a $4^{th}$-order integrator because it includes four integrator stages 110. Moreover, CIC filter 100 is referred to as a $4^{th}$-order CIC filter, for the same reason. Each integrator stage 110 has a filter transfer function H(z) given by $$H(z) = \frac{1}{1 - z^{-1}}$$

The digital circuitry of integrator 102, including that of each integrator stage 110, operates at a clock rate equal to the input sample rate of 320 kHz. That is, digital circuitry of integrator 102, including flip-flops and registers, for example, is clocked at 320 kHz.

Filter/downsampler 108 includes a plurality of substantially identical cascaded FIR filters 112. Each filter 112 has a filter transfer function H(z) given by $$H(z)=1-z^{-1}$$

Filter/downsampler 106 has a magnitude response approximating that of a highpass filter. Filters 112 add transfer function "zeroes" to offset the transfer function "poles" of integrator 102, and thus add stability to CIC filter 100. Since filter/downsampler 106 downsamples by a factor of eight, much of the digital circuitry of filter/downsampler 106 operates at one-eighth the input sample rate of 320 kHz, that is, at 40 kHz.

Since integrator 106 represents a large portion of the total digital circuitry in CIC filter 100, a large portion of the total digital circuitry operates at the high input clock rate. In one example implementation of CIC filter 100, approximately 9,000 NAND-type logic gates operate at 320 kHz, while approximately 13,000 NAND gates operate at 40 kHz. This is approximately equivalent to 10,600 NAND gates operating at 320 kHz.

From above, it is seen that integrator 102 represents a large portion of the digital circuitry in CIC filter 100. Since digital circuitry consumes more power when operated at a high clock rate than when operated at low clock rate, the integrator consumes a disproportionately large amount of the total power consumed by CIC filter 100. Compared to the CIC filter, the decimation system of the present invention significantly reduces the proportion of digital circuitry operated at the high input sample rate, while achieving decimation results identical to the CIC filter. Thus, the decimation filter of the present invention consumes less total power than does the CIC filter, while achieving identical decimation results.

Deriving an FIR Decimation System From a CIC Filter

As mentioned above, an aspect of the present invention is a method of deriving an FIR decimation system from a predetermined CIC filter. Below, there is a description of a commutative sampling identity used in the method. Then, there is a description of deriving an example FIR decimation system from CIC filter 100 (described above), using the commutative sampling identity. After this, there is provided a summary or generalized method of deriving an FIR decimation system.

Commutative Sampling Identity

Figure 2A:
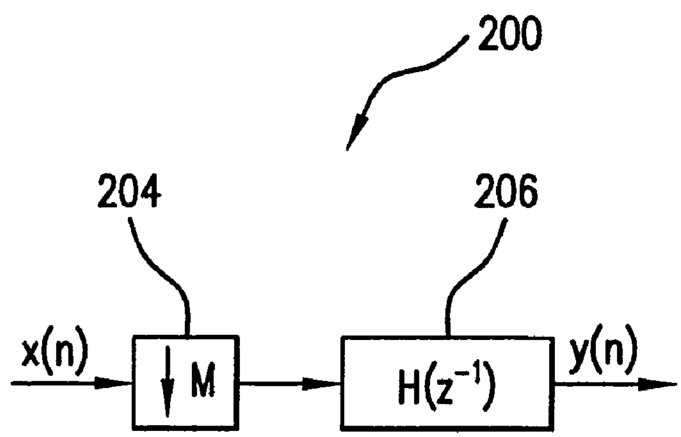
Figure 2B:
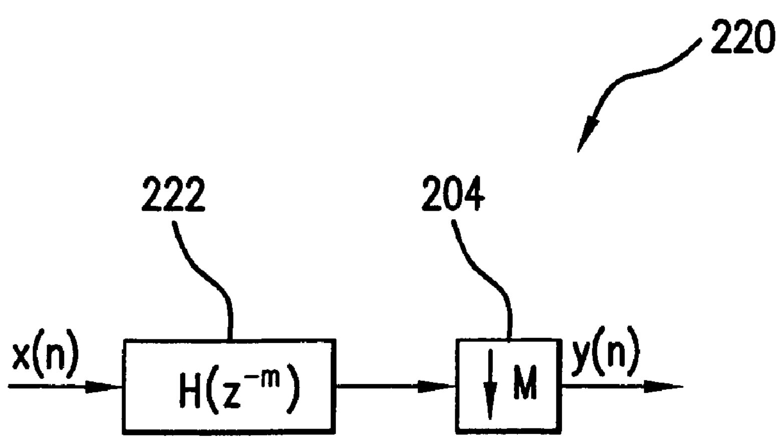

FIGS. 2A and 2B together represent an illustration of what is referred to as the "commutative sampling identity" or just "commutative rule" as applied to sample rate conversion (downsampling or up-sampling) and filtering. FIG. 2A is a block diagram of a sample rate converter 200 including a downsampler 204 followed by a filter 206. Downsampler 204 downsamples an input signal x(n) by a factor M, and then filter 206 filters a downsampled version of the input signal according to the transfer function $H(z^{-1})$. Filter 206 produces an output signal y(n). The operation of converter 200 can be represented by the expression "↓M $H(z^{-1})$," where the symbol "↓" represents the downsampling operation, and ↓M represents downsampling by a factor of M (that is, using a decimation factor of M).

FIG. 2B is a block diagram of a sample rate converter 220 that is functionally equivalent to converter 200 because of the commutative rule mentioned above. Equivalent converter 220 reverses the order of downsampling and filtering compared to converter 200. That is, converter 220 includes a filter 222 followed by downsampler 206. Filter 222 has a transfer function $H(z^{-M})$, instead of the transfer function $H(z^{-1})$ of filter 206. The operation of converter 220 can be represented by the expression "$H(z^{-M})$, followed by ↓M," or more simply, as $H(z^{-M})$ ↓M. Equivalent converter 220 achieves the same results as converter 200. In other words, $H(z^{-M}) \downarrow M \equiv \downarrow M\, H(z^{-1})$. Thus, the operations of filtering and downsampling can be interchanged, that is, commuted, as illustrated in FIGS. 2A and 2B.

Deriving an Example FIR Decimation System

CIC filter 100 of FIG. 1 has a transfer function $H(z)_{CIC}$ represented by:

$$H(z)_{CIC} = \left[\frac{1 - z^{-8}}{1 - z^{-1}}\right]^4 \downarrow 8 \quad \text{Eq. (1)}$$

Since downsampling represents a non-linear process, Eq. (1) is not a strict mathematical representation of the transfer function of CIC filter 100. Rather, Eq. (1) is provided for illustrative purposes.

A first step in deriving the example FIR decimation system includes expanding the transfer function $H(z)_{CIC}$ into a series of expansion terms, including a first expansion term $$\frac{1 - z^{-8}}{1 - z^{-4}},$$

a second expansion term $$\frac{1 - z^{-4}}{1 - z^{-2}},$$

and a third expansion term $$\frac{1-z^{-2}}{1-z^{-1}},$$

as follows:

$$H(z)_{CIC}=\left[\frac{1-z^{-8}}{1-z^{-4}}\frac{1-z^{-4}}{1-z^{-2}}\frac{1-z^{-2}}{1-z^{-1}}\right]^4\downarrow 8 \quad \text{Eq. (2)}$$

It can be seen in Eq. (2) that (i) the first term denominator and the second term numerator cancel one another, and (ii) the second term denominator and the third term numerator cancel one another.

Thus, Eq. (2) can be reduced to Eq. (1) by canceling numerator and denominator terms.

Since ↓8=↓4 ↓2, then Eq. (2) can be re-written as $$H(z)_{CIC}=\left[\frac{1-z^{-8}}{1-z^{-4}}\frac{1-z^{-4}}{1-z^{-2}}\frac{1-z^{-2}}{1-z^{-1}}\right]^4\downarrow 4\downarrow 2 \quad \text{Eq. (3)}$$

This can be considered a downsampling factoring step, since ↓8 is factored into ↓4 and ↓2. In Eq. (3), each of the first two expansion terms, when followed by the downsampling operation ↓4, can be considered to have the general form $H(z^{-M})$ ↓M, as discussed above in connection with FIG. 2B. For example, the first expansion term $$\frac{1-z^{-8}}{1-z^{-4}},$$

followed by ↓4, can be generalized as $$\frac{1-z^{-2M}}{1-z^{-1M}},$$

followed by ↓M, where M=4.

A next step in deriving the example FIR decimation system is an iterative step. This step includes applying the commutative rule to Eq. (3). Specifically, in Eq. (3), the first expansion term $$\frac{1-z^{-8}}{1-z^{-4}}$$

and ↓4 are commuted (reversed) to a corresponding commuted expression $$\downarrow 4\left[\frac{1-z^{-2}}{1-z^{-1}}\right]^4.$$

This commuted expression has the form ↓M $H(z^{-1})$ of FIG. 2A, where M=4. When the first expansion term of Eq. (3) is replaced with its corresponding commuted expression, Eq. (3) becomes $$H(z)_{CIC}=\left[\frac{1-z^{-4}}{1-z^{-2}}\frac{1-z^{-2}}{1-z^{-1}}\right]^4\downarrow 4\left[\frac{1-z^{-2}}{1-z^{-1}}\right]^4\downarrow 2 \quad \text{Eq. (4)}$$

Figure 3A:
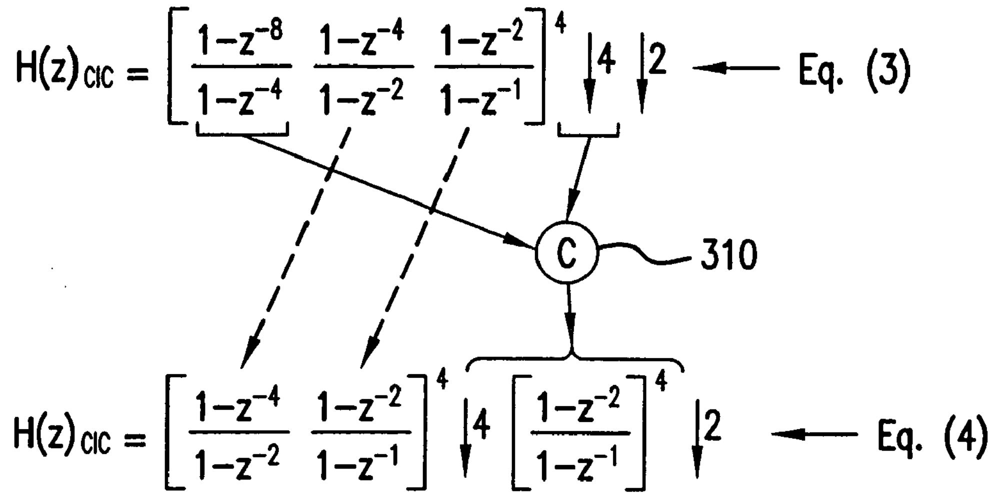
FIG. 3A and 3B are diagrammatic illustrations of expansion term reordering that results from commuting expansion terms with downsampling operations in the present invention.

Commuting the first term of Eq. (3) in the manner described above causes the second and third expansion terms of Eq. (3) to become the first and second expansion terms in Eq. (4), respectively. This expansion term re-ordering is depicted in FIG. 3A. FIG. 3A is a diagrammatic illustration of the expansion term reordering between Eqs. (3) and (4) that is caused as a result of commuting the first expansion term in Eq. 3 with ↓4. In FIG. 3A, the commuting operation is indicated at 310.

Since ↓4=↓2 ↓2, Eq. (4) can be re-written as $$H(z)_{CIC}=\left[\frac{1-z^{-4}}{1-z^{-2}}\frac{1-z^{-2}}{1-z^{-1}}\right]^4\downarrow 2\downarrow 2\left[\frac{1-z^{-2}}{1-z^{-1}}\right]^4\downarrow 2 \quad \text{Eq. (5)}$$

This represents another factoring step. In Eq. (5), the first expansion term $$\frac{1-z^{-4}}{1-z^{-2}},$$

followed by ↓2, can be rewritten as $$\frac{1-z^{-2M}}{1-z^{-1M}}\downarrow M,$$

where M=2. The commutative rule is now applied again, this time, to Eq. (5). Specifically, the first expansion term in Eq. (5), namely, the expansion term $$\frac{1-z^{-4}}{1-z^{-2}},$$

is commuted with ↓2 (that is, M=2 in this iteration). Therefore, the expression $$\frac{1-z^{-4}}{1-z^{-2}}\downarrow 2$$

commutes to a corresponding commuted expression $$\downarrow 2\,\frac{1-z^{-2}}{1-z^{-1}}.$$

When the first expansion term in Eq. (5) is replaced with its corresponding commuted expression, Eq. (5) becomes $$H(z)_{CIC}=\left[\frac{1-z^{-2}}{1-z^{-1}}\right]^4 \downarrow 2\ \left[\frac{1-z^{-2}}{1-z^{-1}}\right]^4 \downarrow 2\ \left[\frac{1-z^{-2}}{1-z^{-1}}\right]^4 \downarrow 2 \quad \text{Eq. (6)}$$

Figure 3B:
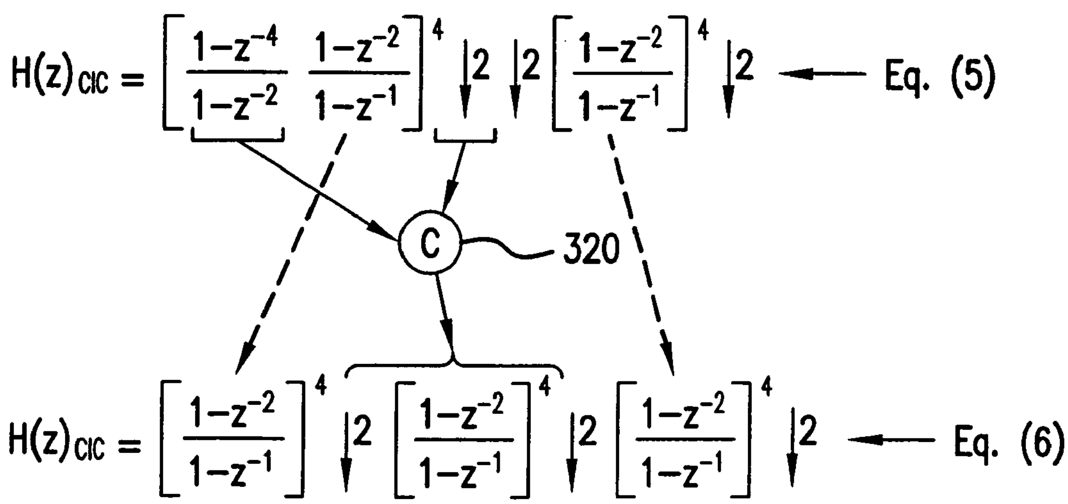

FIG. 3B is a diagrammatic illustration of the expansion term reordering between Eqs. (5) and (6) that is caused as a result of commuting the first expansion term in Eq. 5 with ↓2. In FIG. 3B, the commuting operation is indicated at 320.

A final step includes using a polynomial expansion to reduce each term $$\left[\frac{1-z^{-2}}{1-z^{-1}}\right]^4$$

in Eq. (6) to the form $(1+4z^{-1}+6z^{-2}+4z^{-3}+z^{-4})$. Therefore, Eq. (6) reduces to Eq. (7), below $$H(z)_{CIC}=(1+4z^{-1}+6Z^{-2}+4z^{-3}+z^{-4})\downarrow 2\ (1+4z^{-1}+6Z^{-2}+4z^{-3}+z^{-4})\downarrow 2\ (1+4z^{-1}+6Z^{-2}+4z^{-3}+z^{-4})\downarrow 2$$

In Eq. (7), each term $(1+4z^{-1}+6z^{-2}+4z^{-3}+z^{-4})$ represents an FIR filter transfer function $H(z)_{FIR}$. Thus, Eq. (7) becomes $$H(z)_{CIC}=H(z)_{FIR}\downarrow 2\ H(z)_{FIR}\downarrow 2\ H(z)_{FIR}\downarrow 2 \quad \text{Eq. (8)}$$

Eqs. (7) and (8) represent the example FIR decimation system derived from CIC filter 100. Eq. (8) can be realized as three, substantially identical, cascaded FIR decimation filters, each of the FIR filters causing downsampling by a factor of two, and having the transfer function $$H(z)_{FIR}=(1+4z^{-1}+6z^{-2}+4z^{-3}+z^{-4})=(1+z^{-1})^4 \quad \text{Eq. (9)}$$

From Eq. (9), it is seen that the FIR filter coefficients are the polynomial coefficients produced in the polynomial expansion of $(1+z^{-1})^4$.

According to the above example, a 4th-order CIC filter ($H(z)_{CIC}$) that performs decimation by a factor of eight (8) (where $8=2^3$), can be implemented as three substantially identical cascaded FIR decimation filters. Each FIR decimation filter has a transfer function $H(z)_{FIR}=(1+z^{-1})^4$, and performs decimation by a factor of two. More generally, an $N^{th}$-order CIC filter that performs decimation by a factor $I^L$, can be implemented as a plurality, L, of cascaded FIR decimation filters, where each FIR decimation filter has a transfer function $(1+z^{-1})^N$, and performs decimation by a factor I.

Summary Method

Figure 4:
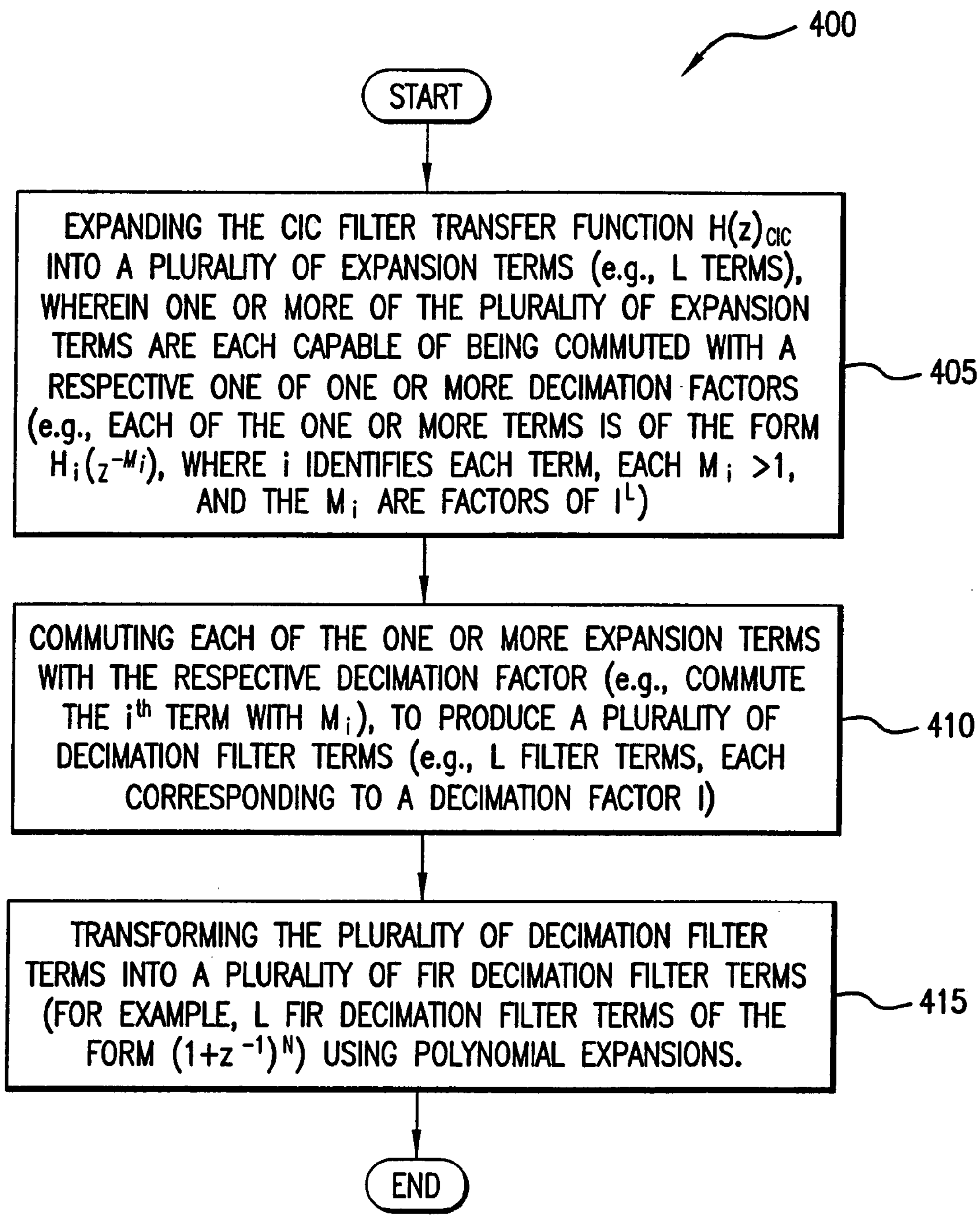
FIG. 4 is a flow chart of an example method of synthesizing a Finite Impulse Response (FIR) decimation system from an $N^{th}$-order CIC filter.

FIG. 4 is a flow chart of an example method 400 of synthesizing an FIR decimation system from an $N^{th}$-order CIC filter (represented as a transfer function $H(z)_{CIC}$) that performs decimation by a factor $I^L$. The FIR decimation system is identical to the CIC filter $H(z)_{CIC}$. That is, the FIR decimation system and the CIC filter achieve identical decimation results.

A first step 405 includes expanding the CIC filter transfer function $H(z)_{CIC}$ into a plurality of expansion terms (for example, into L terms). Each of one or more of the plurality of expansion terms is capable of being commuted with a respective one of one or more decimation factors. For example, step 405 includes expanding $H(z)_{CIC}$ into one or more terms of the form $H_i(z^{-M_i})$, where i identifies each of the one or more terms, and each $M_i$ is a factor of $I^L$ that is greater than one, such that a product of all of the $M_i$ is equal to $I^L$.

Therefore, step 405 can be considered to include a first sub-step of factoring $I^L$ into one or more factors $M_i$, and a second sub-step of deriving the one or more expansion terms such that each term has the form $H_i(z^{-M_i})$.

A next step 410 is an iterative step that includes commuting each of the one or more expansion terms with the respective decimation factor, to produce a plurality of decimation filter terms. For example, step 410 includes commuting each term $H_i(z^{-M_i})$ with ↓M. Steps 405 and 410 produce L filter terms, each corresponding to a decimation factor I.

A next step 415 includes transforming the plurality of decimation filter terms into a plurality of FIR decimation filter terms. For example, this step produces L FIR decimation filter terms of the form $(1+z^{-1})^N$ using polynomial expansions, where each of the FIR decimation filter terms corresponds to decimation by a factor I.

FIR Decimation System

Figure 5:
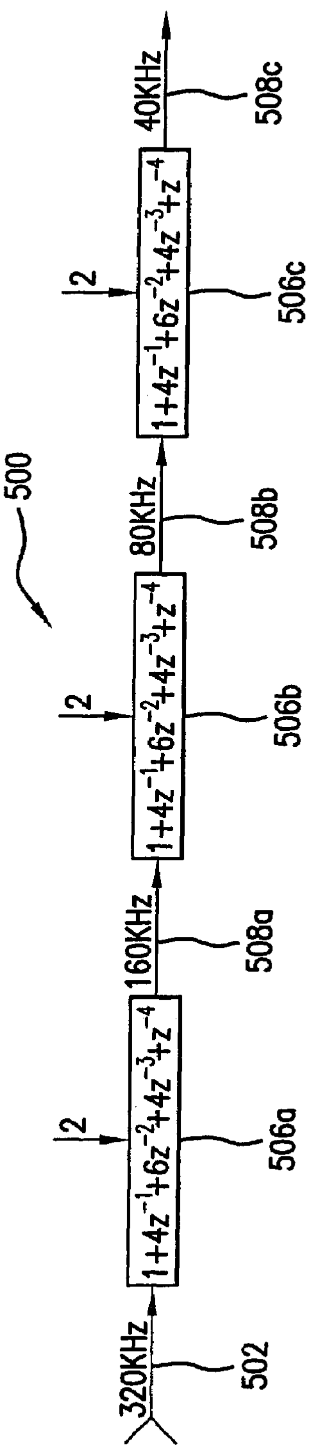
FIG. 5 is a block diagram of an example FIR decimation system.

FIG. 5 is a block diagram of an example FIR decimation system 500 corresponding to Eq. (7) and (8). FIG decimation system 500 achieves decimation results identical, or at least substantially identical, to those achieved using CIC filter 100. System 500 includes a plurality of cascaded FIR decimation filters 506_a_, 506_b_ and 506_c_. Each of the FIR decimation filters 506_a–c_ performs decimation by a factor of two. Also, each of the decimation filters 506_a–c_ has a transfer function $H(z)_{FIR}=(1+z^{-1})^4$. In operation, the first FIR decimation filter 506_a_ receives an input signal 502, having an input sample rate R (where R=320 kHz, for example). Filter 506_a_ filters and downsamples-by-two input signal 502, to produce a decimated output signal 508_a_ at a sample rate R/2 (where R/2=160 kHz, for example). The next filter 506_b_ filters signal 508_a_ and downsamples the signal by a factor of two, to produce a decimated signal 508_b_ at a sample rate R/4 (where R/4=80 kHz, for example). Similarly, filter 506_c_ filters and downsamples-by-two signal 508_b_, to produce a decimated output signal 508_c_ at a sample rate R/8 (where R/8=40 kHz, for example).

Figure 6:
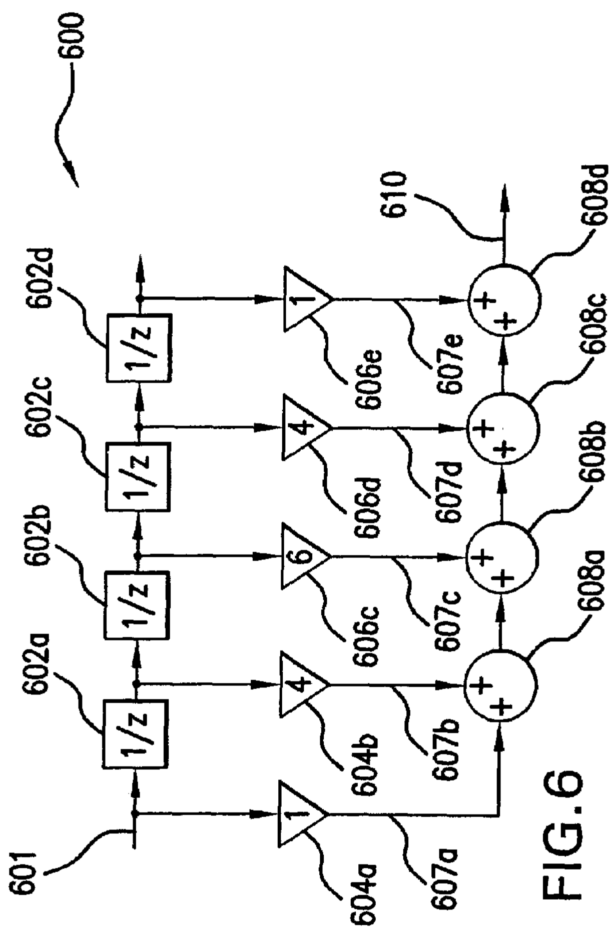
FIG. 6 is a block diagram of an example FIR filter structure that may be used in the FIR decimation system of FIG. 5.

FIG. 6 is a block diagram of an example FIR filter structure 600 that may be used in each of FIR filters 506_a–c_. Structure 600 represents a transversal FIR filter structure. Filter structure 600 includes a plurality of cascaded unit delays 602_a_–602_d_ to successively delay an input signal 601. Structure 600 also includes a plurality of gain stages 604_a_, 604_b_, 604_c_, 604_d_, and 604_e_ to apply respective weights of "1," "4," "6," "4," and "1" to input signal 601 and the successively delayed versions thereof produced by unit delays 602_a_, 602_b_, 602_c_ and 602_d_, as depicted in FIG. 6. In FIG. 6, the weights "1," "4," and so on, applied by each gain stage 604_a_, 604_b_, and so on, are depicted inside the triangular gain stage symbols. These weights represent FIR filter coefficients corresponding to the transfer function $(1+z^{-1})^4$. Gain stages 604_a–e_ provide respective weighted signals 607_a–e_ to cascaded combiners 608_a–d_, as depicted in FIG. 6. The last combiner 608_d_ produces a decimated output signal 610. Filter structure 600 may perform decimation by a factor of two by "dropping" every other output sample in signal 610, as would be apparent to one of ordinary skill in the relevant arts.

Polyphase Decimation Filters

Figure 7:
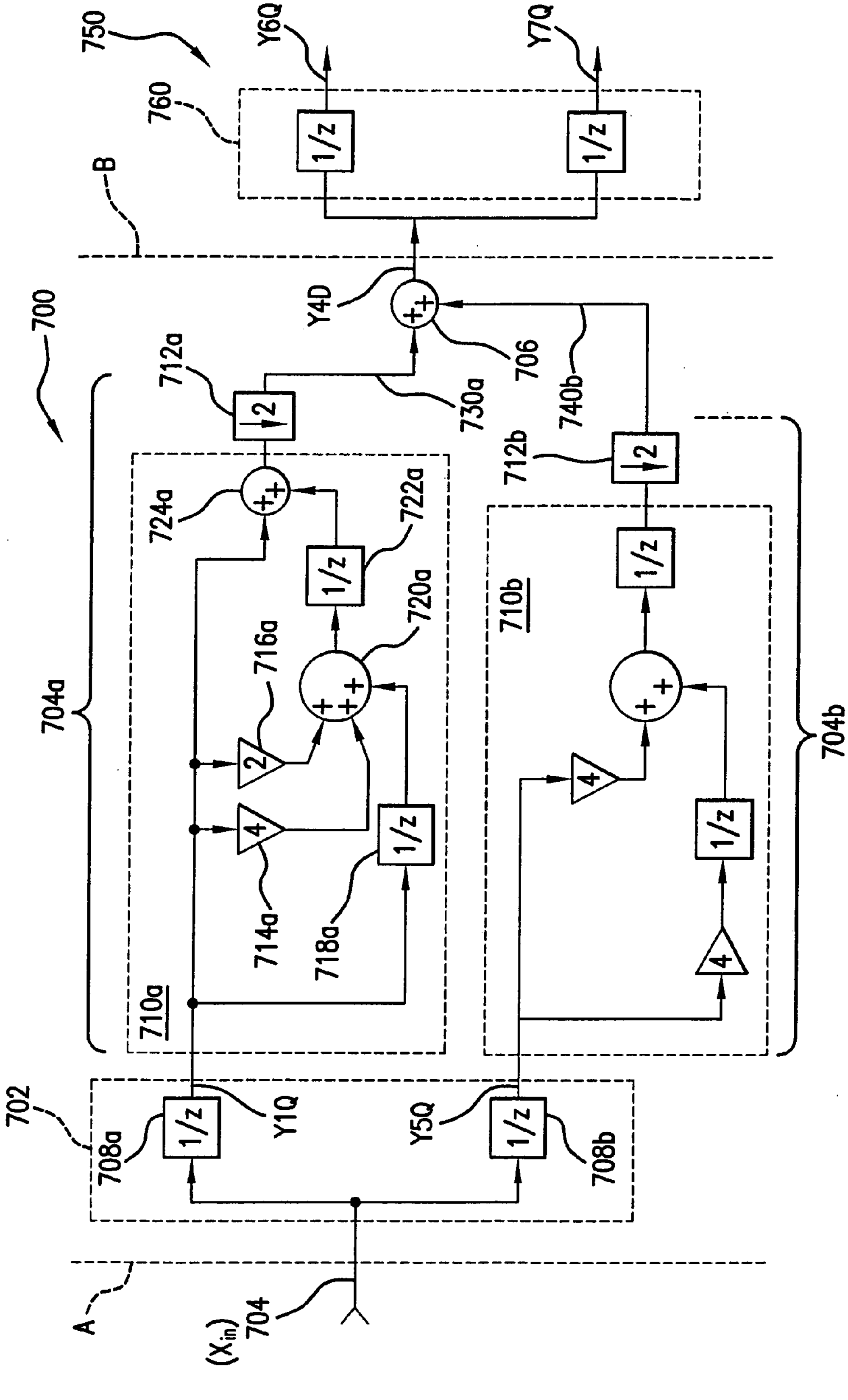
FIG. 7 is a block diagram of an example polyphase filter that may be used in the system of FIG. 5.

Referring again to FIG. 5, each of the cascaded decimation filters 506_a–c_ may include a polyphase filter, whereby decimation system 500 includes a plurality of cascaded polyphase filters. FIG. 7 is a block diagram of an example polyphase filter 700 that may be used in each decimation stage 506*a–c*. Polyphase filter 700 includes all of the elements depicted between spaced, vertical dashed lines A and B. Polyphase filter 700 includes an input stage 702, and a plurality of parallel FIR decimation stages 704*a* and 704*b* each coupled to a respective output of input stage 702. Filter 700 also includes a combiner 706 coupled to respective outputs of the plurality of decimation stages 704*a* and 704*b*.

Input stage 702 receives an input signal 704. For example, if signal 704 represents signal 502, 508*a* or 508*b* in FIG. 5, then filter 700 represents filter 500*a*, 500*b*, or 500*c*, respectively. Input signal 704 may be represented as a sampled sequence including samples $x_1, x_2, x_3, x_4, x_5, x_6 \ldots$, having an input sample rate R (where R=320 kHz, for example). Input stage 702 includes unit delays/samplers 708*a* and 708*b* to respectively sub-sample input signal 704, to produce respective sub-sampled signals Y1Q and Y5Q having respective sample rates R/2. For example, sequence Y1Q includes samples $x_1, x_3, x_5 \ldots$, while sequence Y5Q includes alternate samples $x_2, x_4, x_6 \ldots$. Substantially all of the digital circuitry associated with filter 700, including input stage 702, is clocked at a clock rate equal to the sample rate of sequences Y1Q and Y5Q, namely, at a clock rate R/2. Sub-sampled signals Y1Q and Y5Q are time-shifted with respect to each other.

Input stage 702 provides sequences Y1Q and Y5Q to respective parallel decimation stages 704*a* and 704*b*. Decimation stage 704*a* includes an FIR filter 710*a* followed by a downsampler 712*a* that downsamples by a factor of two. Similarly, decimation stage 704*b* includes an FIR filter 710*b* followed by downsampler 712*b*. FIR filter 710*a* includes first and second gain stages 714*a* and 716*a* for applying gains or weights to sequence Y1Q. Filter 710*a* includes a unit delay 718*a* for delaying sequence Y1Q. The respective outputs of gain stages 714*a* and 716*a* and unit delay 718*a* are each coupled to respective inputs of a combiner/adder 720*a* for combining signals produced by the gain stages and the unit delay. Combiner 720*a* provides a combined signal to a unit delay 722*a*. Unit delay 722*a* provides a delayed combined signal to an output combiner 724*a*, which combines sequence Y1Q with the delayed combined signal 722*a*.

Combiner 724*a* provides a filtered signal to downsampler 712*a*. Downsampler 712*a* provides a decimated output signal component 730*a* to combiner 706. Filter 710*b* provides a filtered signal to downsampler 712*b*. Downsampler 712*b* provides a decimated output signal component 740*b* to combiner 706. Combiner 706 combines decimated output signal components 730*a* and 740*b* to produce decimated output signal Y4D (which may be one of signals 508*a*, 508*b*, and 508*c* in FIG. 5, for example). Output signal Y4D has a sample rate R/2.

If filter 700 is not the last cascaded filter (such as last filter 500*c* in FIG. 5), then filter 700 provides decimated output signal Y4D to a next cascaded filter 750. Only a portion of filter 750, namely an input stage 760, is depicted in FIG. 7. Input stage 760 is substantially identical to input stage 702, described above. Input stage 760 operates at a clock rate R/4 (where R/4=80 kHz, for example), and produces each of sub-sampled sequences Y6Q and Y7Q at the sample rate R/4. Substantially all of the digital circuitry of filter 750 is clocked at a clock rate R/4.

Figure 8:
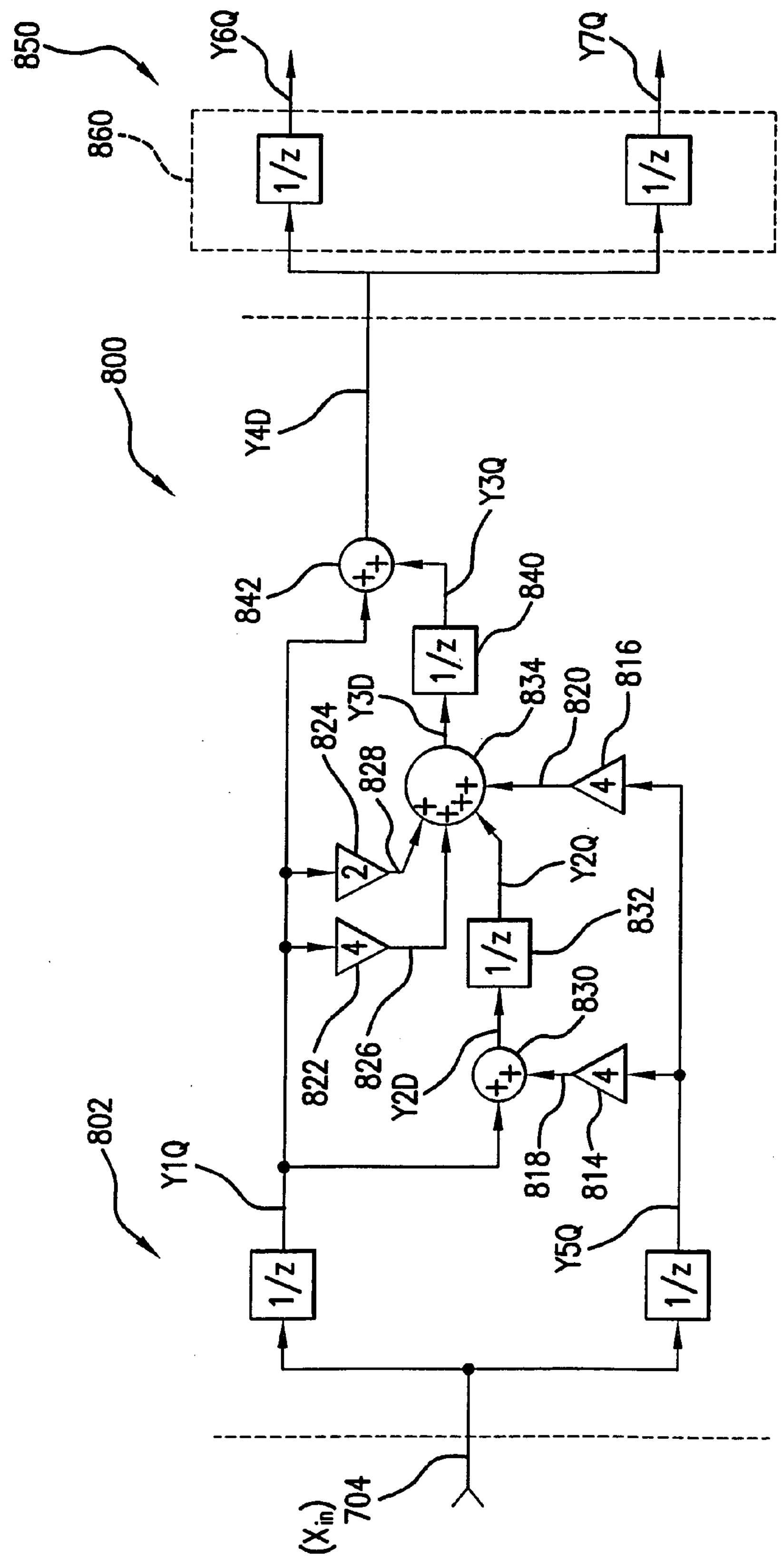
FIG. 8 is a block diagram of another example polyphase filter that may be used in the system of FIG. 5.

FIG. 8 is a block diagram of a polyphase filter 800, according to an alternative embodiment of the present invention. Filter 800 uses less circuit elements (for example, logic gates) and thus less power than does filter 700, but achieves the same decimation results as filter 700. The elements of filter 800, described below, are clocked at the clock rate R/2.

Filter 800 includes an input stage 802 that is substantially identical to input stage 702 described above in connection with FIG. 7. Filter 800 includes first and second gain stages 814 and 816, to respectively apply first and second weights to signal Y5Q, to produce respective weighted signals 818 and 820. Filter 800 includes third and fourth gain stages 822 and 824 to apply respective third and fourth weights to signal Y1Q, to produce respective weighted signals 826 and 828. Filter 800 includes a first combiner 830 for combining signal Y1Q with signal 818, to produce a combined signal Y2D. Filter 800 includes a unit delay 832 to produce a delayed signal Y2Q from signal Y2D. A combiner 834 combines signals Y2Q, 826, 828 and 820 to produce a combined signal Y3D. A delay 840 delays signal Y3D to produce delayed signal Y3Q. A combiner 842 combines signals Y3Q with Y1Q to produce the combined signal Y4D.

Filter 800 provides signal Y4D to a next cascaded filter 850 (assuming filter 800 is not the last cascaded filter). Only an input portion 860 of filter 850 is depicted in FIG. 8. Filter 850 operates at a clock rate R/4.

In an embodiment where each of the filters 500*a–c* of system 500 are implemented using the structure of filter 800, approximately 1500 NAND gates (that is, logic gates) are clocked at the rate R (for example, 320 kHz), 4200 logic gates are clocked at the rate R/2 (for example, 160 kHz), 5100 logic gates are clocked at the rate R/4 (for example, 80 kHz), and 3300 logic gates are clocked at the rate R/8 (for example, 40 kHz). This approximates to 5300 logic gates being clocked at the rate R. Therefore, in this embodiment, a much smaller proportion of the digital circuitry in system 500 operates at the high input clock rate as compared to CIC filter 100 (which has approximately 9000 logic gates clocked at the rate R). Therefore, this embodiment consumes only a half the power that CIC filter 100 consumes, yet achieves decimation results identical, or at least substantially identical, to that of CIC filter 100. The present invention is not limited to the above-mentioned example number of logic gates. Alternative numbers of logic gates can be used.

Figure 9:
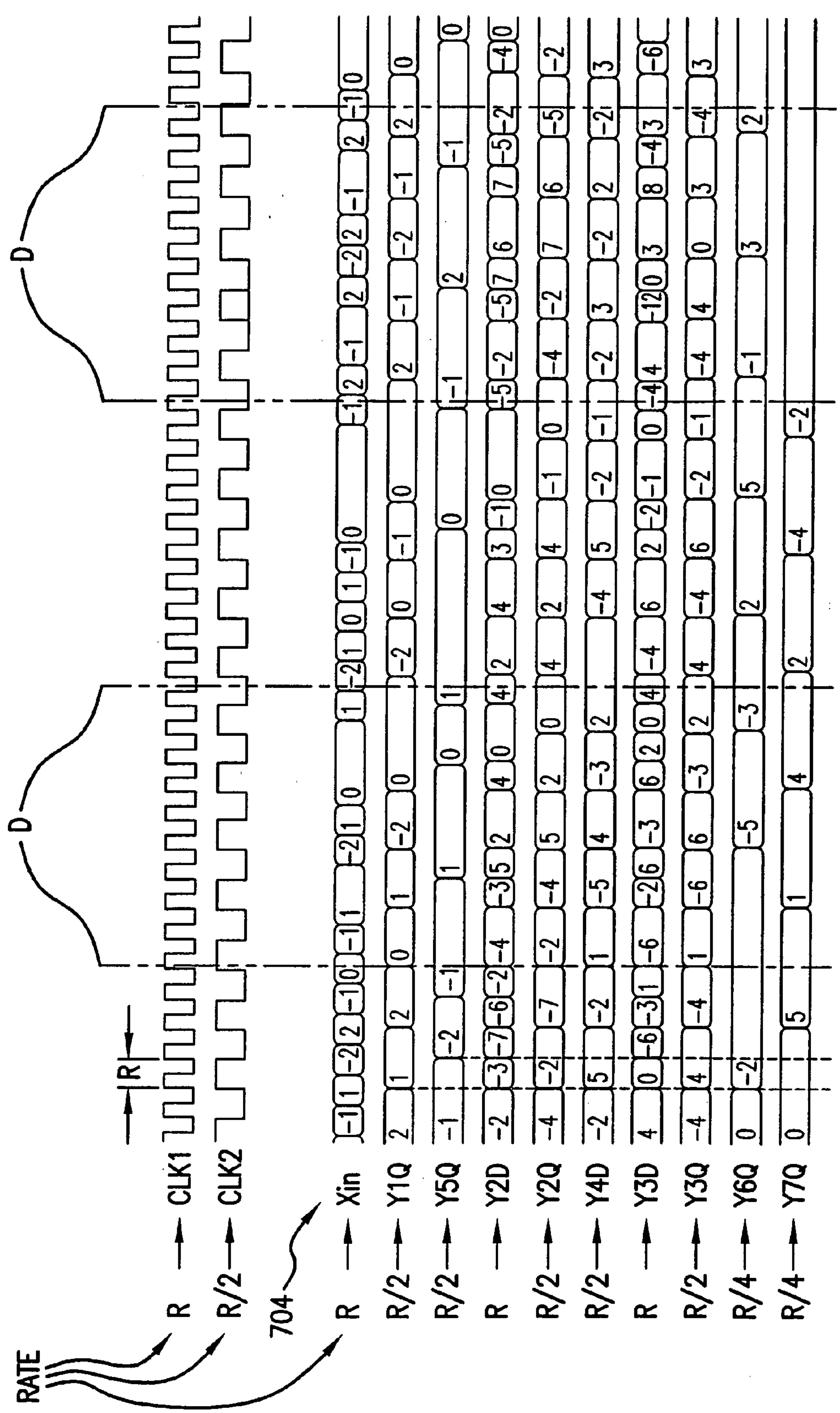
FIG. 9 is an illustration of example signal waveforms or timing diagrams for various signals/sequences referenced in FIGS. 7 and 8.

FIG. 9 is an illustration of example signal waveforms or timing diagrams for various signals/sequences referenced in FIGS. 7 and 8. The timing relationships between the various example waveforms are also depicted in FIG. 9. For example, vertical spaced lines D indicated timing relationships between various ones of the waveforms depicted in FIG. 9. Waveforms CLK1 and CLK2 represent example clock signals that are used to clock logic gates in filters 700 and 800. Also indicated in FIG. 9 are the sample/clock rates (for example, R, R/2, and so on) of the various waveforms.

Also, example data values associated with the various signals, are indicated in FIG. 9. For example, signal 704 (Xin) includes successive data samples having data values −1, 1, −2, 2, −1, 0, and so on, traversing the waveform from left-to-right in FIG. 9. Signals Y1Q and Y5Q are sub-sampled sequences having data sample values taken alternately from signal Xin.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A decimation system, comprising:

a plurality of cascaded Finite Impulse Response (FIR) decimation filters, each of the FIR decimation filters having a transfer function $H(z)=(1+z^{-1})^N$, where N is an integer;

wherein each of at least two of the plurality of cascaded FIR decimation filters includes a polyphase FIR filter;

wherein each of the polyphase filters is configured to receive a respective input signal, each of the polyphase filters including an input stage that generates a plurality of sub-sampled signals from the respective input signal;

a plurality of parallel FIR decimation stages, each of the parallel FIR decimation stages for producing a respective decimated output signal component from a respective one of the plurality of sub-sampled signals; and a signal combiner for combining the plurality of decimated output signal components produced by the plurality of decimation stages, whereby the combiner produces a decimated output signal;

wherein each of the parallel FIR decimation stages includes an FIR filter and a downsampler following the FIR filter.

2. The system of claim 1, wherein the plurality of cascaded FIR decimation filters together achieve a decimation result substantially identical to that of a Cascaded Integrator-Comb (CIC) filter having N cascaded integrator stages.

3. The system of claim 1, wherein each of the FIR decimation filters is configured to perform decimation by a common decimation factor I.

4. The system of claim 1, wherein each of the polyphase filters has the transfer function H(z).

5. A decimation system, comprising:

a plurality of cascaded Finite Impulse Response (FIR) decimation filters, each of the FIR decimation filters having a transfer function $H(z)=(1+z^{-1})^N$, where N is an integer;

wherein each of at least two of the plurality of cascaded FIR decimation filters includes a polyphase FIR filter;

wherein at least one of the polyphase filters comprises:

an input stage having an input, a first output, and a second output;

first and second gain stages having their respective inputs coupled to the first output of the input stage;

third and fourth gain stages having their respective inputs coupled to the second output of the input stage;

a first combiner having respective inputs coupled to the second output of the input stage sequence generator, and an output of the first gain stage;

a first unit delay having an input coupled to an output of the first combiner;

a second combiner having respective inputs coupled to an output of the first unit delay, an output of the second gain stage, an output of the third gain stage, an output of the fourth gain stage; and a second unit delay having an input coupled to an output of the second combiner; and a third combiner having respective inputs coupled to an output of the second unit delay, and the second output of the input stage.

6. A method of performing decimation, comprising:

(a) performing successive stages of Finite Impulse Response (FIR) decimation filtering, each of the stages of FIR decimation filtering using a transfer function $H(z)=(1+z^{-1})^N$, where N is an integer;

wherein each of at least two of the successive stages of FIR decimation filtering includes polyphase FIR filtering wherein said step of polyphase filtering includes generating a plurality of sub-sampled signals from an input signal;

producing, in parallel, a decimated output signal component from each of the plurality of sub-sampled signals; and combining the plurality of decimated output signal components, to produce a decimated output signal wherein said producing step includes separately FIR filtering each of the sub-sampled signals to produce respective FIR filtered signals; and downsampling each of the FIR filtered signals, to produce the decimated output signal components.

7. The method of claim 6, wherein step (a) achieves a decimation result substantially identical to that achieved by performing decimation using a Cascaded Integrator-Comb (CIC) decimation filter including N cascaded integrator stages.

8. The method of claim 6, wherein each of the successive stages of FIR decimation filtering causes decimation by a decimation factor I, whereby step (a) causes decimation by a decimation factor $I^L$.

9. The method of claim 6, wherein said step of polyphase filtering includes polyphase FIR filtering using the transfer function H(z).

10. A method of performing decimation, comprising:

performing successive stages of Finite Impulse Response (FIR) decimation filtering, each of the stages of FIR decimation filtering using a transfer function $H(z)=(1+z^{-1})^N$, where N is an integer;

generating, from an input signal, a first sub-sampled signal and a second sub-sampled signal;

applying first and second weights to the first sub-sampled signal to produce respective first and second weighted signals;

applying third and fourth weights to the second sub-sampled signal to produce respective third and fourth weighted signals;

combining the second signal, and the first weighted signal, to produce a first combined signal;

producing a delayed first combined signal;

combining the delayed first combined signal, the second weighted signal, the third weighted signal, and the fourth weighted signal, to produce a second combined signal;

producing a delayed second combined signal; and combining the delayed second combined signal, and the second signal, to produce a decimated output signal.

* * * * *

UNITED STATES PATENT AND TRADEMARK OFFICE

CERTIFICATE OF CORRECTION

PATENT NO. : 7,010,557 B2
APPLICATION NO. : 10/106549
DATED : March 7, 2006
INVENTOR(S) : Minsheng Wang It is certified that error appears in the above-identified patent and that said Letters Patent is hereby corrected as shown below:

<u>Column 11</u>
Line 59, please delete "sequence generator".

Signed and Sealed this

Eighth Day of August, 2006

JON W. DUDAS
*Director of the United States Patent and Trademark Office*